United States Patent
Zhao et al.

(10) Patent No.: US 9,654,148 B2
(45) Date of Patent: May 16, 2017

(54) RECONFIGURABLE ECC FOR MEMORY

(71) Applicant: Samsung Electronics Co., Ltd., Suwon-si, Gyeonggi-do (KR)

(72) Inventors: Weifeng Zhao, Fremont, CA (US); Shupeng Sun, Pittsburgh, PA (US); Jianfeng Liu, Hwaseong-si (KR); Ming Zhang, Foster City, CA (US); Bernard Ho, Fremont, CA (US)

(73) Assignee: SAMSUNG ELECTRONICS CO., LTD. (KR)

( * ) Notice: Subject to any disclaimer, the term of this patent is extended or adjusted under 35 U.S.C. 154(b) by 117 days.

(21) Appl. No.: 14/590,985

(22) Filed: Jan. 6, 2015

(65) Prior Publication Data

US 2016/0196179 A1 Jul. 7, 2016

(51) Int. Cl.
| | |
|---|---|
| *G11C 29/00* | (2006.01) |
| *H03M 13/35* | (2006.01) |
| *G11C 29/52* | (2006.01) |
| *G11C 29/02* | (2006.01) |
| *G06F 11/10* | (2006.01) |
| *H03M 13/05* | (2006.01) |
| *G11C 29/04* | (2006.01) |

(52) U.S. Cl.
CPC ....... *H03M 13/353* (2013.01); *G06F 11/1048* (2013.01); *G11C 29/028* (2013.01); *G11C 29/52* (2013.01); *H03M 13/356* (2013.01); *G11C 2029/0411* (2013.01); *H03M 13/05* (2013.01)

(58) Field of Classification Search
CPC ... G06F 11/1068; G11C 29/52; H03M 13/353
See application file for complete search history.

(56) References Cited

U.S. PATENT DOCUMENTS

| | | |
|---|---|---|
| 8,122,319 B2 | 2/2012 | Peddle |
| 8,307,258 B2 | 11/2012 | Flynn et al. |
| 2008/0072120 A1* | 3/2008 | Radke ................ G06F 11/1068 714/768 |
| 2013/0039129 A1 | 2/2013 | Radke et al. |
| 2013/0145207 A1 | 6/2013 | Resnick |

* cited by examiner

*Primary Examiner* — Sam Rizk
(74) *Attorney, Agent, or Firm* — Renaissance IP Law Group LLP

(57) ABSTRACT

According to one general aspect, an apparatus may include a memory and a reconfigurable error correction array. The memory may be configured to store data. The reconfigurable error correction array may be configured to provide a plurality of levels of error correction to the memory based, at least in part, upon a number of errors detected within the memory.

18 Claims, 6 Drawing Sheets

100

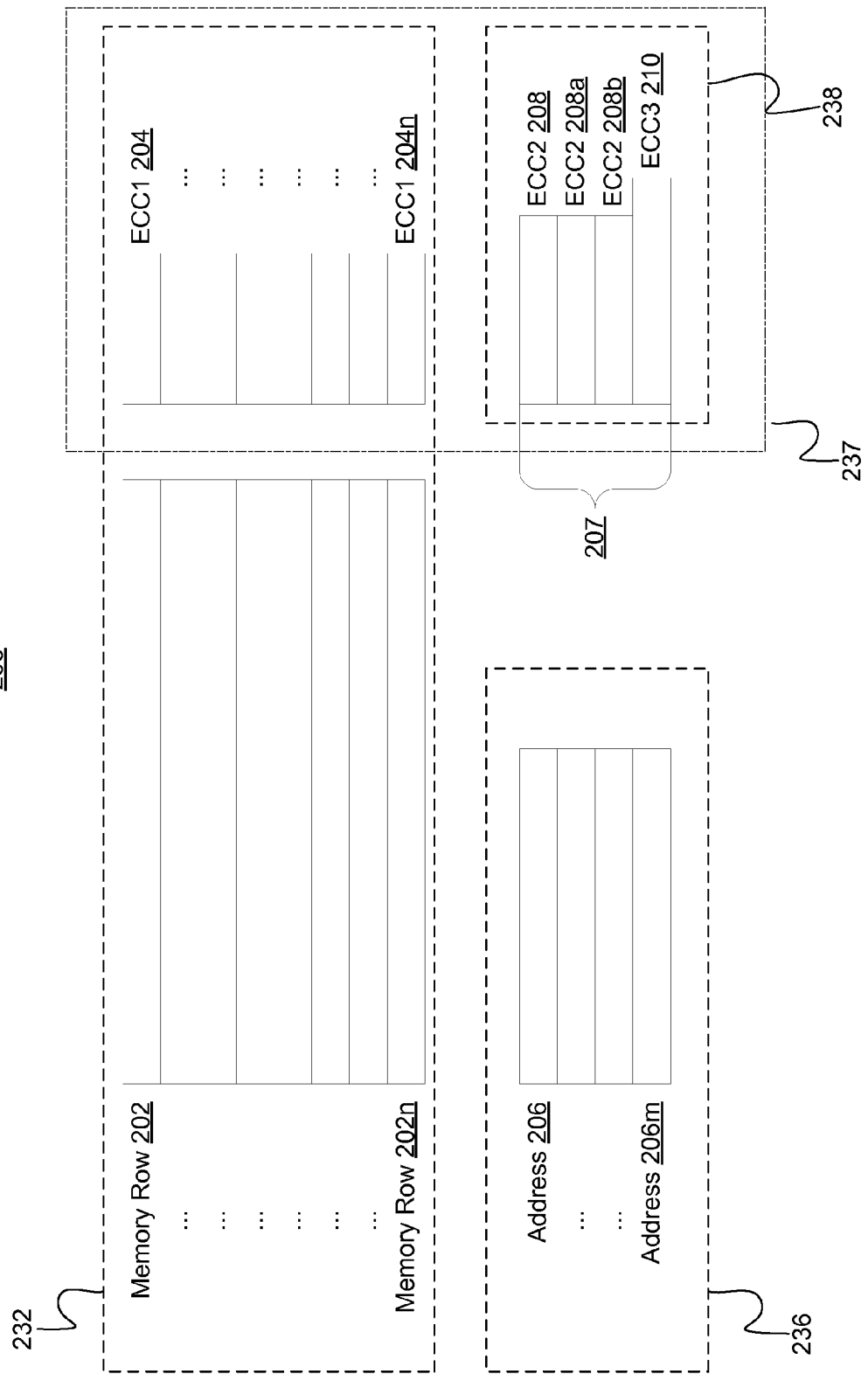

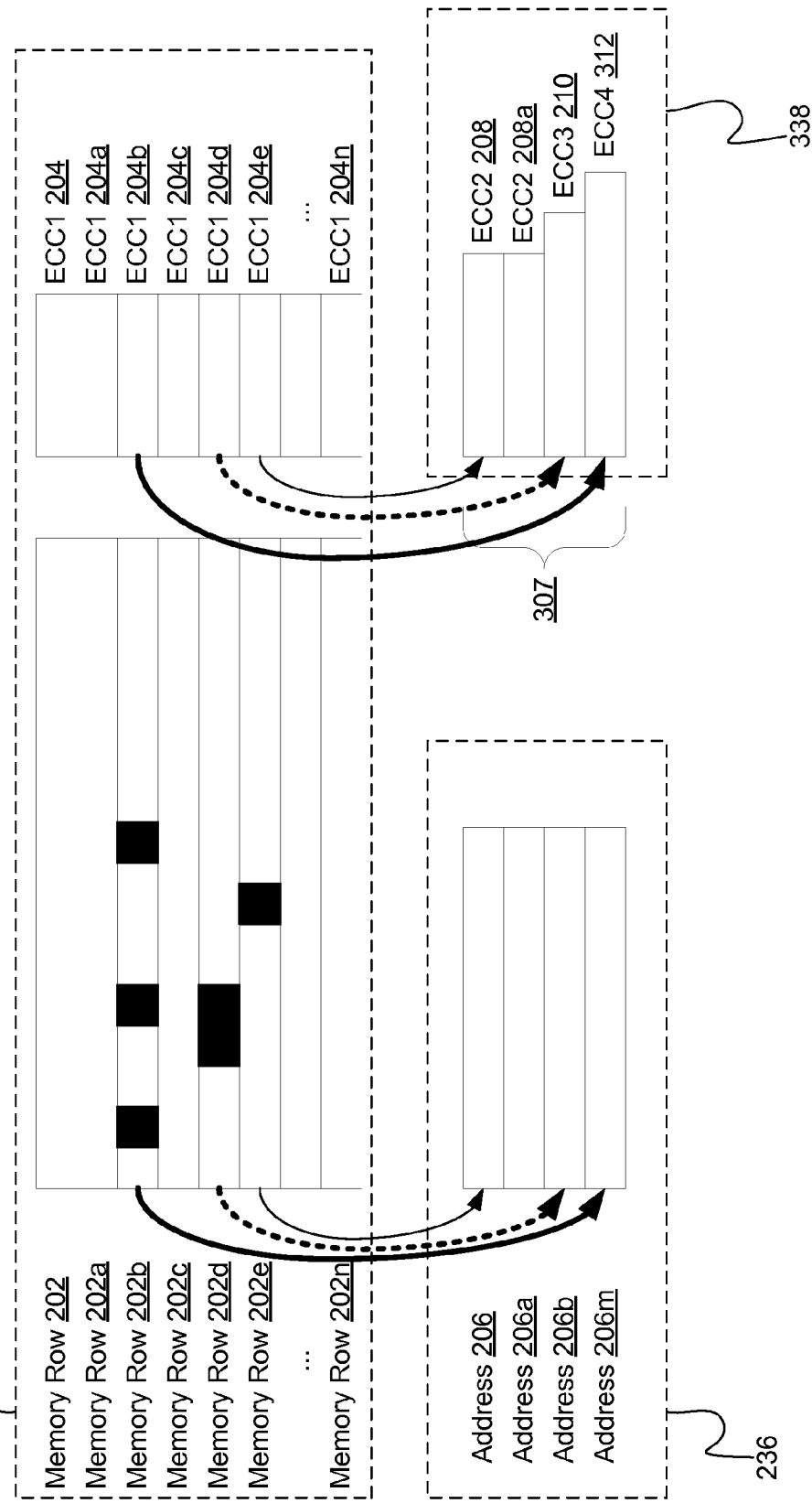

301

RECONFIGURABLE ECC FOR MEMORY

TECHNICAL FIELD

This description relates to the storing of information, and more specifically the error detection and correction thereof.

BACKGROUND

Modern semiconductor memory devices often use error checking and error correction bits to provide a reliable storage means for processors or other components. Generally, error-correcting code memory (ECC memory) is a type of computer data storage that may detect and/or correct the most common kinds of internal data corruption. ECC memory is used in most computers where data corruption cannot be tolerated under any circumstances, such as for scientific or financial computing.

Ideally, ECC memory creates a memory system in which the data that is read from each word or memory location is always the same as the data that had been written to it, even if a single bit (or more in some cases) that was actually stored has been flipped or changed to the wrong state (e.g., a "1" to a "0", etc.). Traditionally a method of providing that memory protection is to use a Hamming code that is calculated based on the data portion of each memory word, typically 32 or 64 bits wide. Often, the Hamming code is chosen such that it can correct single bit errors in the memory word, and detect up to two total memory bits in error.

Some non-ECC memory with parity support allows errors to be detected, but not corrected; otherwise errors are not detected. In such a system, one or more extra bits of data are added to a memory. These extra bits indicate whether or not the actual or subject data includes an even or odd number of "1"s. Generally, with such a system the flipping of a single-bit within the actual data may be detected but not corrected.

Often the ECC code word or parity bit(s) are stored and fetched in parallel with the data word and the check is generated (for writes) and/or verified (for reads) as the memory access takes place. Generally, an immediate or substantially immediate correction or detection of errors is possible.

SUMMARY

According to one general aspect, an apparatus may include a memory and a reconfigurable error correction array. The memory may be configured to store data. The reconfigurable error correction array may be configured to provide a plurality of levels of error correction to the memory based, at least in part, upon a number of errors detected within the memory.

According to another general aspect, a method may include detecting an amount of error included in a memory row of a memory, wherein the memory row is configured to store data. The method may include determining an associated error correction scheme that is associated with the amount of error. The method may further include, if the associated error correction scheme is other than a minimal error correction scheme, disassociating the memory row with a respective minimal error correction block, and associating the memory row with an increased error correction block, wherein the increased error correction block conforms with the associated error correction scheme.

According to another general aspect, a system may include a processor and a memory system. The processor may be configured to perform operation upon data. The memory system may include a memory configured to store data, and a reconfigurable error correction array configured to provide a plurality of levels of error correction to the memory based, at least in part, upon a number of errors detected within the memory.

The details of one or more implementations are set forth in the accompanying drawings and the description below. Other features will be apparent from the description and drawings, and from the claims.

A system and/or method for the storing of information, substantially as shown in and/or described in connection with at least one of the figures, as set forth more completely in the claims.

BRIEF DESCRIPTION OF THE DRAWINGS

FIG. 2 is a block diagram of an example embodiment of a system in accordance with the disclosed subject matter.

FIG. 3a is a block diagram of an example embodiment of a system in accordance with the disclosed subject matter.

Like reference symbols in the various drawings indicate like elements.

DETAILED DESCRIPTION

Figure 1:
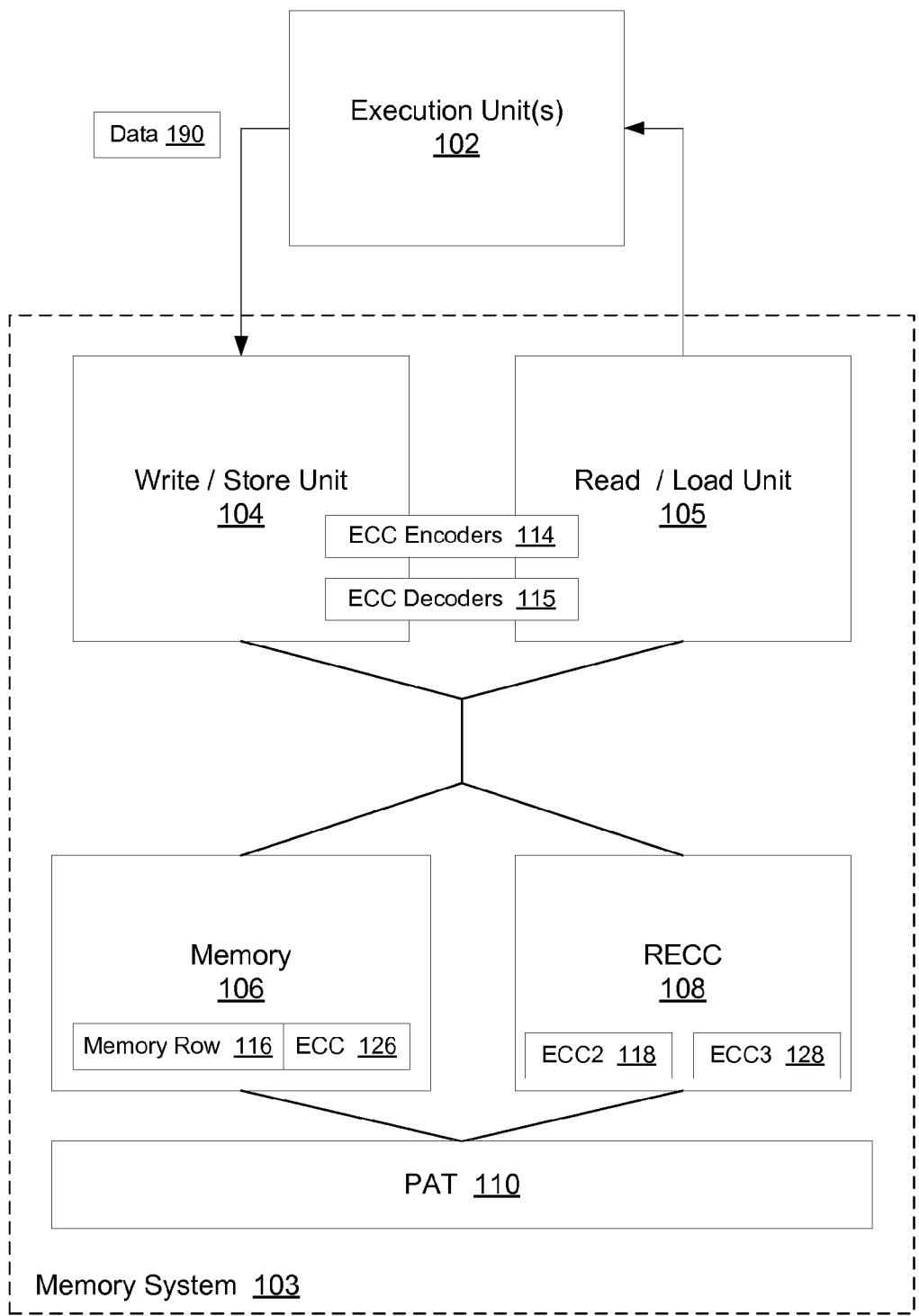
FIG. 1 is a block diagram of an example embodiment of a system in accordance with the disclosed subject matter.

Various example embodiments will be described more fully hereinafter with reference to the accompanying drawings, in which some example embodiments are shown. The present disclosed subject matter may, however, be embodied in many different forms and should not be construed as limited to the example embodiments set forth herein. Rather, these example embodiments are provided so that this disclosure will be thorough and complete, and will fully convey the scope of the present disclosed subject matter to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of the present disclosed subject matter.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present disclosed subject matter. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present disclosed subject matter.

Unless otherwise defined, all terms (including technical and scientific terms) used herein have the same meaning as commonly understood by one of ordinary skill in the art to which this disclosed subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

In this context, a "hard error" includes an error that occurs because of a physical defect in the memory (e.g. a "stuck at" error or a broken wire, etc.) that causes the data to be stored incorrectly. In various embodiments, a hard error may be corrected by the memory (e.g., via the ECC scheme, etc.) or by disabling the defective memory row and using a redundant memory row. In this context, a "soft error" includes an error or flipping of a bit or bits within a memory word or row that causes the data that is read to differ from the data that had been written (e.g., caused by a spurious electrical charge, a cosmic ray impact, etc.). In various embodiments, a soft error may be corrected either by the memory (e.g., via the ECC scheme, etc.) or by re-writing the correct data within the affected memory location or a different memory location. In general, hard errors are considered permanent features of the device (although undesirable), whereas soft errors are generally viewed as transient. It is understood that the above is merely one illustrative example to which the disclosed subject matter is not limited. It is further understood that the occurrence of a soft error is not limited to just a data portion of a memory and may occur in other memory portions, such as, for example an ECC portion of the memory, etc., FIG. 1 is a block diagram of an example embodiment of a system 100 in accordance with the disclosed subject matter. In various embodiments, the system 100 may include a system-on-a-chip (SoC), a processor, or other computing device or circuit, such as, for example, a laptop, desktop, workstation, personal digital assistant, smartphone, tablet, and other appropriate computers, etc. or a virtual machine or virtual computing device thereof.

In one embodiment, the system 100 may include one or more execution units 102 (e.g., a processor, a floating-point unit, etc.) configured to perform a given operation or function on or utilizing a piece of data 190. In various embodiments, the system 100 may include a memory system 103. In such an embodiment, the memory system 103 may be configured to store various pieces of data 190 and to handle or service read and/or write requests from various execution units 102.

In various embodiments, the memory system 103 may include a memory 106 (e.g., a cache, a memory chip, a static random access memory (SRAM), NAND memory, etc.) that is configured to store data 190. In such an embodiment, the memory 106 may include a plurality of memory rows 116 each configured to store a respective piece or word of data 190. In various embodiments, the memory 106 may also include a plurality of error correction code (ECC) bits or information 126. Each memory row 116 may be associated with a respective ECC block or field 126, such that each memory row is provided with certain level of ECC protection. In the illustrated embodiment, each of these ECC fields 126 may provide their respective memory rows 116 and stored data pieces with the same level of ECC protection.

For example, one level of ECC protection may be capable to performing single-error correction (SEC) and double error detection (DED) or SEC/DED. Conversely, a second level of ECC protection may be capable of performing double-error correction (DEC) and triple error detection (TED) or DEC/TED. In addition, a third level of ECC protection may be capable of triple error correction and quadruple error detection (TEC/QED), and so on. It is understood that the above are merely a few illustrative examples to which the disclosed subject matter is not limited.

In general, ECC memory uses extra bits to store an encrypted code with the data. When the data is written to memory, the ECC code is also generally stored. Upon being read back, a second ECC code is generated based upon the read data. This second or read ECC code may be compared to the ECC code generated when the data was written. If the codes do not match, they are decrypted to determine which bit in the data is incorrect. The erroneous bit or bits may be "flipped" or corrected and the corrected data may be presented to the reading unit or device.

Generally, the greater the level of protection provided by an ECC scheme (e.g., SEC/DED vs. DEC/TED), the greater the number of extra or protective bits are required. For example, if the data portion includes 8 bits, a SEC/DED scheme may require 5 ECC bits, in one embodiment. Using those 5 encoded bits a memory system would be able to correct or "flip" 1 erroneous bit in the data portion. If 2 bits are erroneous, the best the memory system may be able to do is detect the errors but would not be able to correct them. Likewise, 3 or more erroneous bits may cause a SEC/DED scheme to neither detect nor correct the error.

As mentioned above, the higher the level of protection provided by an ECC scheme (e.g., SEC/DED vs. DEC/TED), the greater the number of extra or protective bits are required. So, in one embodiment, a DEC/TED scheme may require 8 ECC bits for 8 bits of data. However, for those extra 3 bits (versus the 5-bit SEC/DED scheme), the memory system may be able to correct or "flip" up to 2 erroneous bits and detect cases in which up to 3 erroneous bits occur. Likewise, a TEC/QED scheme would require more than 8 ECC bits for 8 bits of data, and so on. ECC schemes that provide more protection would require more encoding bits. It is understood that the above are merely a few illustrative examples to which the disclosed subject matter is not limited.

In various embodiments, the number of bits used in an ECC scheme may vary based upon an encoding technique employed by that scheme. Some encoding schemes may include Hamming codes, Hsiao codes, Reddy codes, Bose-Chaudhri-Hocquenghemgggg (BCH) code, etc. It is understood that the above are merely a few illustrative examples to which the disclosed subject matter is not limited.

In addition, the number of bits employed in an ECC scheme may vary based upon the size of the data portion. For example, in a Hamming code the number of bits in the data portion compared to the number of ECC bits do not scale linearly. In various embodiments, an 8 bit data portion may require 5 ECC bits in an SEC/DEC scheme that employs a Hamming code. However, in a version of the same SEC/DEC scheme that uses a 64 bit data portion or block size, 7 ECC bits (as opposed to 30 ECC bits if the encoding scheme scaled linearly) may be required.

In various embodiments, the ratio of data portion bits to ECC bits may scale linearly or non-linearly. It is understood that the above is merely one illustrative example to which the disclosed subject matter is not limited.

In the illustrated embodiment and in many traditional applications the memory 106 may be configured to provide a basic or minimal level of ECC protection (e.g., SEC/DED, etc.). Unfortunately, as that level of ECC protection is generally minimal, if the number of faults in the memory 106 or a respective memory row 116 exceeds the ability of the ECC 126 to correct an error, the memory row 116 becomes unreliable for storing information. As such, either the system 100 has to be degraded, as the capacity of the memory 106 has to be reduced (i.e. the unreliable memory rows are not used), or the system 100 or memory 106 has to be replaced. Traditionally, redundant memory rows 116 (and ECC fields 126) are included in the memory 106 in order to replace any defective memory rows. Alternately, the operational voltage of the memory 106 may be increased to overcome any parametric failures that might cause such errors. The determination of whether or not a memory row 116 is defective is traditionally done during the manufacturing process or quality assurance portion thereof. However, instead of employing redundant memory rows, in the illustrated embodiment, the system 100 may correct for defective memory rows 116 without the need to resort to such costly or dramatic amelioration measures.

In the illustrated embodiment, the system 100 may include a reconfigurable ECC array 108. In various embodiments, the RECC array 108 may be configured to provide a plurality of levels of error correction to the memory 106. In some embodiments, the level of error correction provided to each memory row 116 or selected memory rows 116 may be based, at least in part, upon a number of errors detected within the respective memory row 116, as described below in regards to FIGS. 3a and 3b.

In such an embodiment, the RECC array 108 may include a plurality of ECC fields or blocks, such as ECC2 118 and ECC3 128. In an illustrative embodiment, ECC2 118 may include enough bits to provide the memory 106 or a portion of the memory rows 116 with a level of error correction that includes DEC/TED, whereas ECC3 128 may be configured to provide TEC/QED. It is understood that the above are merely a few illustrative examples to which the disclosed subject matter is not limited.

As described below, during manufacture or testing of the system 100, the reliability of the individual memory rows 116 may be tested. If a particular memory row 116 is found to be unreliable or defective, the degree of unreliableness may be determined (e.g., 1-bit is unreliable, 2-bits are unreliable, etc.). After determining the degree of unreliableness, one may determine the amount or level of ECC protection needed to make the memory row 116 acceptably reliable. As described below, in various scenarios or usage cases different levels of protection may be considered acceptable. For example, in one embodiment, it may be accept to only correct hard errors, whereas in another embodiment, it may be desirable to correct both hard and anticipated soft errors. It is understood that the above are merely a few illustrative examples to which the disclosed subject matter is not limited.

In various embodiments, the system 100 may include a programmable address table (PAT) 110 configured to indicate which, if any, of the plurality of memory rows 116 is associated with an increased level of error correction. In such an embodiment, once a particular memory row 116 is determined to be defective and in need of an additional level of error correction, the address of the memory row 116 may be entered into the PAT 110. Further, the PAT 110 may be configured to associate the defective memory row 116 with a particular ECC field of the RECC array 108 (e.g., ECC2 118, ECC3 128, etc.).

In such an embodiment, instead of storing the ECC data (e.g., Hamming code, etc.) for the defective memory row 116 in the minimal ECC field 126, the ECC data for the defective memory row 116 may be stored in an enhanced or increase ECC field of the RECC array 108 (e.g., ECC2 118, ECC3 128, etc.). In various embodiments, these increased ECC fields may include more bits than the minimal ECC fields 126 and may therefore allow for the correction and/or detection of a greater number of defective bits within the memory row 116.

In various embodiments, the particular increased level of protection (and therefore ECC field within the RECC array 108) may be determined based upon the number of defective bits within the defective memory row 116. This is described in more detail in regards to FIGS. 3a and 3b.

In one embodiment, when the execution unit 102 desires to write a piece of data 190 to the memory 106, the execution unit 102 may issue or make a write or store request to the memory system 103. In various embodiments, the system 100 may include a write or store unit 104. In such an embodiment, the store unit 104 may be configured to process, at least in part, a write operation to store a piece of data within a location (e.g., a memory row 116, etc.) included by the memory 106.

In such an embodiment, the store unit 104 may be configured to determine what level of error protection is associated with or provided to the target location, address, or memory row 116. In the illustrated embodiment, the store unit 104 may be configured to determine if the address of the memory row 116 is within the PAT 110. If the address of the memory row 116 is not within the PAT 110, the store unit 104 may then generate an ECC based upon the ECC scheme employed by or associated with the minimal level of ECC protection provided by the ECC field 126. The store unit 104 may then store the data 190 within the target memory row 116 and the corresponding ECC within the respective ECC field 126.

Conversely, if the address of the memory row 116 is within the PAT 110 (i.e. the target memory row 116 is defective), the store unit 104 may determine the level of ECC protection provided to the memory row 116 by the RECC array 108. Based upon that level of protection, the store unit 104 may generate the appropriate ECC. In such an embodiment, the store unit 104 may then store the data 190 within the memory row 116 and the generated ECC within the ECC field (e.g., ECC2 118, ECC3 128, etc.) of the RECC array 108 that is associated with the target memory row 116 (via the PAT 110).

In various embodiments, the store unit 104 may include a plurality of ECC encoders 114. Each ECC encoder 114 may be configured to generate a certain level of ECC (e.g., SEC/DED, DEC/TED, TEC/QED etc.). In such an embodiment, the data 190 may be routed to and used as input by the desired ECC encoder 114 based upon the level of error correction needed by the target memory row 116. In a less desirable embodiment, a generic ECC encoder 114 may be employed. It is understood that the above are merely a few illustrative examples to which the disclosed subject matter is not limited.

In another embodiment, if the execution unit 102 wishes to retrieve or read data 190 from the memory 106, the execution unit 102 may issue a read or load request to the read or load unit 105. In various embodiments, the load unit 105 may be included in the system 100 and configured to process, at least in part, a read or load operation to read a piece of data from a location (e.g., a memory row 116, etc.) included by the memory 106.

Likewise, similar to the write case described above, the load unit 105 may determine the level of error correction provided to the target memory row 116. In such an embodiment, this may include consulting the PAT 110. The load unit 105 may then read the data 190 from the target memory row 116 and the associated ECC field (e.g., minimal ECC 126 or increased ECC fields 118 or 128, etc.). The load unit 105 may decode the ECC via an appropriate ECC decoder 115 and determine if the data 190 includes an error and if that error (if any) is correctable. Similarly to the store unit 104, in various embodiments, the load unit 105 may include a plurality of ECC decoders 115, one for each level of error correction. It is understood that the above are merely a few illustrative examples to which the disclosed subject matter is not limited.

In some embodiments, the store unit 104 and the load unit 105 may be integrated as a single load/store unit. In various embodiments, the store unit 104 and/or load unit 105 may be included by the execution unit 102. Also, it is understood that the target location being written to or read from may include only a portion of a memory row 116 or a plurality of memory rows 116. In such an embodiment, the entire memory row including the sub-portion may be read/written and the ECCs thereof processed, as described above.

FIG. 2 is a block diagram of an example embodiment of a system 200 in accordance with the disclosed subject matter. In the illustrated embodiment, the system 200 may include a memory 232, a reconfigurable ECC (RECC) array 238 and a PAT 236.

In various embodiments, the memory 232 may include a plurality of memory rows (e.g., memory row 202, memory row 202n, etc.) In the illustrated embodiment, the memory 232 may include an N number of memory rows 202. As described above, in various embodiments, the memory 232 and each of the memory rows 202 may be configured to store various pieces of data.

In the illustrated embodiment, the memory 232 may also include a plurality or array of minimal ECC blocks or bits (e.g. ECC1 204, ECC1 204n, etc.). In such an embodiment, there may be a 1-to-1 correspondence between memory rows 202 and minimal ECC blocks 204. In the illustrated embodiment, since there are N memory rows 202 there may be N minimal ECC blocks 204. In various embodiments, each of these minimal ECC blocks 204 may be configured to provide their associated memory row 202 with a minimal level of ECC protection (illustrated as ECC1). In such an embodiment, each minimal ECC block 204 may include a predetermined number of bits based upon the number of bits included in the memory row 202, the ECC encoding scheme, and the level of ECC protection provided by the minimal ECC level (e.g., SEC/DED, etc.).

As described below in reference to FIGS. 3a & 3b, if a memory row 202 is determined to include an undesirable number of defective bits or errors, the defective memory row 202 may be afforded or provided with an increased level of ECC protection. In such an embodiment, the address or other identifier of the defective memory row 202 may be entered into the PAT 236.

In such an embodiment, the PAT 236 may include a plurality of address fields or indicators (e.g., address field 206, address field 206m, etc.). In various embodiments, the PAT 236 may include an M number of address fields 206. In some embodiments, the PAT 236 may include a number of address fields 206 that is less than or equal to the number of memory rows 202.

In various embodiments, each address field 206 may be associated with an increased ECC field or array block 207 (e.g., ECC2 208, ECC3 210, etc.). In such an embodiment, the number of address fields 206 may be equal to the number of ECC fields or array blocks 207 in the RECC array 238.

In such an embodiment, the increased ECC field or array block 207 may provide bits configured to store the ECC bits associated with various ECC codes (e.g., ECC2, ECC3, etc.). As described above, the greater the level of protection provided by an ECC scheme (e.g., SEC/DED vs. DEC/TED), the greater the number of extra or protective bits are required. In such an embodiment, as each increased ECC field or array block 207 provides a greater level of protection than the minimal ECC blocks 204, the bit-width of each increased ECC field or array block 207 than the bit-width of the minimal ECC blocks 204.

In various embodiments, the RECC array 238 may include a plurality of ECC fields or array blocks 207 (e.g., ECC2 208, ECC3 210, etc.). In various embodiments, each of the array blocks 207 may provide a predetermined level of error correction protection. For example, in the illustrated embodiment, the RECC array 238 may include three array blocks 207 capable of providing a second tier or level of error correction protection (e.g., ECC2 208, ECC2 208a, ECC2 208b), and one array block 207 capable of providing a third tier or level of error correction protection (e.g., ECC3 210). In various embodiments, the second level of error correction (ECC2) may provide DEC/TED, and the third level of error correction (ECC3) may provide TEC/QED. It is understood that the above is merely one illustrative example to which the disclosed subject matter is not limited.

As described above, in one embodiment, if a memory row 202 is determined to be defective, its associated minimal ECC field 204 may no longer be used or may be disabled, and the defective memory row's ECC may be stored in an increased ECC field or array block 207. As described above, this increased ECC field or array block 207 may provide a higher or increased level of error correction protection (e.g., DEC/TED versus SEC/DED, etc.).

In one embodiment, the RECC array 238 may also be employed to correct memory errors that are due to operating voltage issues (e.g., parametric errors, etc.). In some embodiments, a memory error may disappear or no longer occur once an operating voltage (e.g., Vcc, Vmin, etc.) is increased. In such an embodiment, the Vmin of the memory 106 may be reduced. In such an embodiment, this may cause one or more errors, as described above.

However, using the RECC array 238, memory rows that are defective at the lowered Vmin may be associated with an increased ECC field or array block 207, and such parametric errors may be compensated for or hidden from a user. It is understood that the above is merely one illustrative example to which the disclosed subject matter is not limited.

In one embodiment, the number of array blocks 207 per level of error correction may be predetermined. In another embodiment, the number of array blocks 207 may be dynamically configurable. For example, if an ECC3 array block 207 is not needed (e.g., if no memory row 202 is defective enough to warrant ECC3 protection), the ECC3 array block (ECC3 210) may be reconfigured to support ECC2. In one such an embodiment, raising an array block's error correction (e.g., from ECC2 to ECC3, etc.) may not be possible as the higher level of error correction may require a greater number of bits than the lower error correction array block 207 includes. However, in yet another embodiment, the RECC array 238 may not include fixed or static array blocks 207 but may instead include an aggregated memory that may be dynamically partitioned to form the array blocks 207. In such an embodiment, the number of array blocks 207 dedicated to each level of error correction (e.g., ECC2, ECC3, etc.) may be fully configurable. It is understood that the above are merely a few illustrative examples to which the disclosed subject matter is not limited.

The bounding box 237 illustrates that, in one embodiment, the minimal ECC fields (e.g., ECC 204) and the increased error correction fields or array blocks 207 may be considered a common RECC array. In such an embodiment, the memory 106, and RECC 108 of FIG. 1 may be integrated. Likewise, in various embodiments, the PAT 236 and RECC array 238 may be aggregated into a common table or memory element. In such an embodiment, the RECC 108, and PAT 110 of FIG. 1 may be integrated. It is understood that the above are merely a few illustrative examples to which the disclosed subject matter is not limited.

As described above, in a preferred embodiment, when a defective memory row 202 is detected, the minimal ECC field (e.g., ECC1 204, etc.) may be ignored, disabled, or not used, in favor of the newly associated increased ECC field or array block 207 (e.g., ECC2 208, ECC3 210, etc.). However, in another embodiment, the array blocks 207 of the RECC array 238 may not include all of the bits required for the respective error correction level or scheme. In such an embodiment, the array blocks 207 may only include an additional number of bits needed to raise the error correction level to the increased error correction level. In such an embodiment, the total number of bits required for the increased error correction level may be provided by both the minimal error correction field (e.g., ECC1 204) and the increased error correction level (e.g., ECC2 208). For example, if the ECC1 scheme requires 8-bits and ECC2 scheme requires 10-bits, in such an embodiment, ECC2 208 may include only 2-bits (10-bits minus the 8-bits provided by ECC1 204). In such an embodiment, the minimal error correction level field (e.g., ECC 204) may still be used even if its associated memory row 202 is determined to be defective. In such an embodiment, the load/store unit may still employ an ECC2 encoder/decoder, but the result/input may be stored/taken from two ECC array blocks (e.g., ECC1 204 and ECC2 208, etc.) instead of only one (e.g., ECC2 208, etc.). In such an embodiment, ECC1 204 may provide 8-bits of the ECC and ECC2 208 may provide 2-bit, thereby totally the 10-bits of the ECC2 scheme. It is understood that the above is merely one illustrative example to which the disclosed subject matter is not limited.

In various embodiments, the RECC array 238 may include multiple ECC fields or array blocks 207. Each ECC array block 207 may conform to a particular ECC scheme, (e.g., named ECC1, ECC2, ECC3, . . . , ECCK, etc.). In various embodiments, each ECC scheme may be capable of handling errors up to K bits in size. For example, the ECC1 scheme may be capable to performing single-error correction (SEC) and double error detection (DED) or SEC/DED. Conversely, ECC2 may be capable to performing double-error correction (DEC) and triple error detection (TED) or DEC/TED. ECC3 may be capable of triple EC and quadruple ED (TEC/QED), and so on. It is understood that the above are merely a few illustrative examples to which the disclosed subject matter is not limited.

In some embodiments, this may allow for variations in the design of the systems or memories (e.g., system 100, memory system 103, etc.) to address different markets, for example, mission critical applications and/or cost sensitive applications. In one such embodiment, for a mission critical application, an ECCk scheme may be used to correct (k-1) bits or hard errors, while the remaining capability is reserved to combat soft errors. For example, an ECC2 scheme (e.g., SEC/DED) may be employed to correct a 1 bit hardware failure, a ECC3 scheme (e.g., SEC/DED) may be employed to correct 2-bits of hardware failures, as needed, leaving a remaining bit-correcting capability to handle soft errors.

Two example embodiments showing various ways in which the RECC array may be employed are described herein; although, it is understood that they are merely a few illustrative examples to which the disclosed subject matter is not limited. The first embodiment, shown in reference to FIG. 3a, includes the use of a RECC array in a mission critical application. The second embodiment, shown in reference to FIG. 3b, includes the use of a RECC array in a cost sensitive application.

FIG. 3a is a block diagram of an example embodiment of a system 300 in accordance with the disclosed subject matter. In the illustrated embodiment, the system 300 may include a memory 232, a reconfigurable ECC (RECC) array 338 and a PAT 236. As described above, FIG. 3a shows an example embodiment in which the RECC array 338 is employed within a mission critical application or other embodiment in which tolerance to errors is relatively low. It is understood that FIG. 3a is merely one illustrative example to which the disclosed subject matter is not limited.

In various embodiments, the first or minimal level of error correction (ECC1), included by the memory 232, may provide SEC/DED. In various embodiments, the other or increased levels of error correction may be provided by using the RECC array 338. In the illustrated embodiment, the second level of error correction (ECC2) may provide DEC/TED, the third level of error correction (ECC3) may provide TEC/QED, and the fourth level of error correction (ECC4) may provide quad or 4-bit error correction and five-bit error detection (QEC/5ED). It is understood that the above is merely one illustrative example to which the disclosed subject matter is not limited.

In the illustrated embodiment, the RECC array 338 may include four array blocks 307 comprising two ECC2 array blocks 208 and 208a, one ECC3 array block 210 and one ECC4 array block 312. It is understood that the above is merely one illustrative example to which the disclosed subject matter is not limited.

In the illustrated embodiment, once the device is manufactured, it may be tested for detection of errors or defects in the memory 232 (illustrated by the black squares). In a traditional system, the defective memory rows (e.g., memory row 202b, memory row 202d, memory row 202e, etc.) may be marked as invalid and reassigned to various redundant memory rows (not illustrated). However, in the illustrated embodiment and as described above, when an error is detected during product testing (or otherwise) in a memory row 202, a more powerful or increased ECC scheme, such as DEC/TED, TEC/QED etc., may be configured to replace the minimal SEC/DED ECC scheme. In such an embodiment, the use of redundant memory rows and/or voltage increases may be avoided.

For example, in the illustrated embodiment, three hard errors may be detected in the memory row 202b. In order to correct three errors either the ECC3 (TEC/QED) or ECC4 (QEC/5ED) schemes may be used. As this is a fault intolerant application or embodiment, the ECC4 scheme may be selected. This allows 1-bit of soft error to be corrected in addition to the 3-bits of hard error in the defective memory row 202b. In such an embodiment, the ECC 4 scheme may be associated with the array block ECC4 312. In turn, this array block ECC4 312 may be associated with the address field 206m. In such an embodiment, the address of the defective memory row 202b may be entered or stored within the address field 206m. The ECC for the defective memory row 202b may be computed using the ECC4 scheme and the result stored within the array block ECC4 312. The minimal protection array block ECC1 204b may be unused, disabled, or ignored.

In another example, in the illustrated embodiment, two hard errors may be detected in the memory row 202d. In order to correct two errors either the ECC4 (QEC/5ED), ECC3 (TEC/QED), or ECC2 (DEC/TED) schemes may be used. As this is a fault intolerant application or embodiment, the ECC3 scheme may be selected. This allows 1-bit of soft error to be corrected in addition to the 2-bits of hard error in the defective memory row 202d. In such an embodiment, the ECC3 scheme may be associated with the array block ECC3 210. In turn, this array block ECC3 210 may be associated with the address field 206b. In such an embodiment, the address of the defective memory row 202d may be entered or stored within the address field 206b. The ECC for the defective memory row 202d may be computed using the ECC3 scheme and the result stored within the array block ECC3 210. The minimal protection array block ECC1 204d may be unused, disabled, or ignored.

In yet another example, in the illustrated embodiment, one hard error may be detected in the memory row 202e. In order to correct one error either the ECC1 (SEC/DED) or ECC2 (DEC/TED), etc. schemes may be used. As this is a fault intolerant application or embodiment, the ECC2 scheme may be selected. This allows 1-bit of soft error to be corrected in addition to the 1-bit of hard error in the defective memory row 202e. In such an embodiment, the ECC2 scheme may be associated with the array blocks ECC2 208 and ECC2 208a. As array block ECC2 208 is first and currently unused, it may be selected in this illustrative example. In turn, this array block ECC2 208 may be associated with the address field 206. In such an embodiment, the address of the defective memory row 202e may be entered or stored within the address field 206. The ECC for the defective memory row 202e may be computed using the ECC2 scheme and the result stored within the array block ECC2 208. The minimal protection array block ECC1 204e may be unused, disabled, or ignored.

In such an embodiment, as the memory rows 202, 202a, 202c, and 202n have no hard errors, they may continue to employ the minimal ECC blocks 204, 204a, 204c, and 204n. Likewise, in the illustrated embodiment, the array block ECC2 208a and address field 206a may be unused, as there is no memory row in need of the additional ECC protection they provide. It is understood that the above is merely one illustrative example to which the disclosed subject matter is not limited.

In another embodiment, if a memory row 202 includes so many hard errors than the RECC array 338 is not able to provide an adequate level of ECC protection, the defective memory row 202 may be reassigned to a redundant memory row (not illustrated), as described above. In yet another, less preferred embodiment, if a defective memory row 202 includes so many hard errors than the RECC array 338 is not able to provide an adequate level of ECC protection, the level of ECC protection deemed acceptable may be reduced (e.g., a "graceful" failure). For example, if four errors are found and an ECC5 scheme (e.g., 5EC/6ED) is not available, the defective memory row may be associated with the ECC4 scheme (e.g., QEC/5ED), despite this meaning that any soft errors would only be detectable but not correctable. It is understood that the above is merely one illustrative example to which the disclosed subject matter is not limited.

In some other embodiments, reassignment to a redundant memory row may occur because the memory 232 includes so many defective memory rows 202 that not all of the defective memory rows 202 may be associated with one of the array blocks 307 (e.g., there may be five defective memory rows 202, but only four array blocks 307, etc.). For example, if there are M number of address fields 206 and array blocks 307, but there are greater than M defective memory rows 202, the first M defective memory rows may be attended to by the RECC array 338 and PAT 236, while any defective memory rows after the first M rows, may be replaced by a redundant memory row (if available). In various embodiments, a more complex or otherwise different assignment scheme for determining which defective memory rows are attended to by the RECC array 338 may be employed. It is understood that the above are merely a few illustrative examples to which the disclosed subject matter is not limited.

In the illustrated embodiment, the system 300 may not include any redundant memory rows, and the correction for any defective memory rows (e.g., memory rows 202*b*, 202*d*, 202*e*, etc.) may be provided via the RECC array 338 and the PAT 236.

In the illustrated embodiment, the allocation and association between the memory rows 202 and the RECC array 338 and PAT 236 is illustratively shown as the result of post-manufacture testing and is substantially static once the association has occurred. In another embodiment, the association between the memory rows 202 and the various ECC schemes (and therefore fields of the RECC array 338 and PAT 236) may be substantially dynamic or subject to change. In such an embodiment, the system 300 (e.g., via a load/store unit) may monitor the number of errors associated with a memory row (e.g., over time, within a certain period of time, in the aggregate, etc.) and if the number of errors for a particular memory row 202 increase, the system 300 may be configured to dynamically reassign or increase the level of the ECC scheme associated with that memory row 202. For example, if the number of errors in the memory row 202*c* increases from zero to one (e.g., due to ageing, product damage, a large number of environmentally caused soft errors, etc.), the memory row 202*c* may become associated with array block ECC2 208*a* instead of the original array block ECC1 204*c*. It is understood that the above is merely one illustrative example to which the disclosed subject matter is not limited.

Figure 3B:
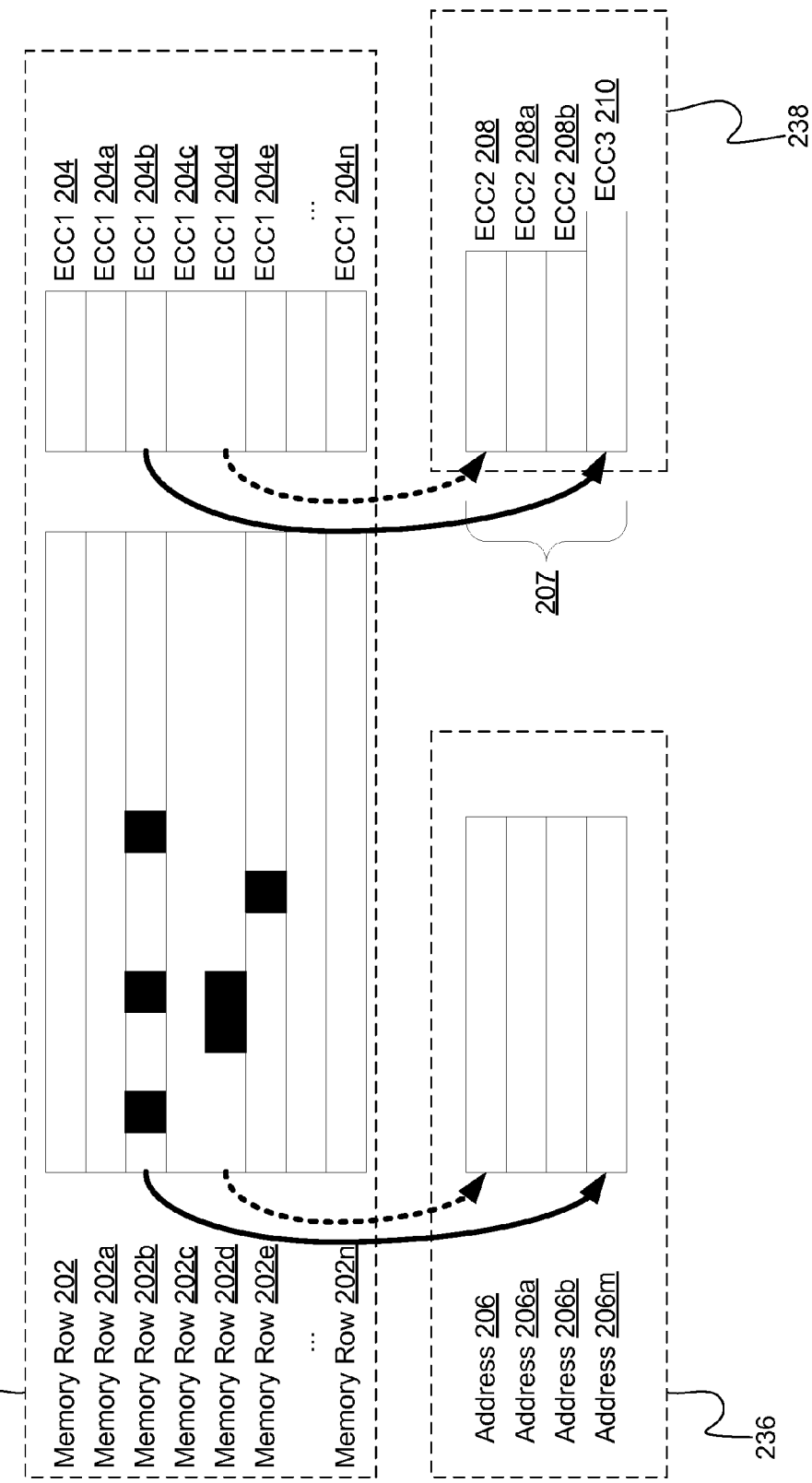
FIG. 3b is a block diagram of an example embodiment of a system in accordance with the disclosed subject matter.

FIG. 3*b* is a block diagram of an example embodiment of a system 301 in accordance with the disclosed subject matter. In the illustrated embodiment, the system 301 may include a memory 232, a reconfigurable ECC (RECC) array 238 and a PAT 236. FIG. 3*b* shows an example embodiment in which the RECC array 338 is employed within a cost sensitive application (e.g., one in which ECC resources may be devoted to yield improvement) or another embodiment in which tolerance of errors is relatively high. It is understood that FIG. 3*b* is merely one illustrative example to which the disclosed subject matter is not limited.

Again, in various embodiments, the first or minimal level of error correction (ECC1), included by the memory 232, may provide SEC/DED. In various embodiments, the other or increased levels of error correction may be provided by the RECC array 238. In the illustrated embodiment, the second level of error correction (ECC2) may provide DEC/TED, and the third level of error correction (ECC3) may provide TEC/QED. In such an embodiment, the RECC array 238 and the associated ECC encoders/decoders may be less costly (in terms of manufacture and design, etc.) It is understood that the above is merely one illustrative example to which the disclosed subject matter is not limited.

In the illustrated embodiment, the RECC array 238 may include four array blocks 207 comprising three ECC2 array blocks 208, 208*a*, and 208*b*; and one ECC3 array block 210. It is understood that the above is merely one illustrative example to which the disclosed subject matter is not limited.

In the illustrated embodiment, once the device is manufactured (or at another point in time), it may be tested for detection of errors or defects in the memory 232 (illustrated by the black squares). In a traditional system, the defective memory rows (e.g., memory row 202*b*, memory row 202*d*, memory row 202*e*, etc.) may be marked as invalid and reassigned to various redundant memory rows (not illustrated). However, in the illustrated embodiment and as described above, when an error is detected during product testing (or otherwise) in a memory row 202, a determination may be made as to how severe the error is. As this is an example of a cost-sensitive application, it may be considered acceptable to merely detect a soft error but not be able to correct it. Further, it may be acceptable that only hard errors be corrected. In such an embodiment, if the error level is deemed to be acceptably handled or protected by the minimal ECC scheme (e.g., SEC/DED) the minimal ECC scheme may still be employed despite the error in the memory row. However, if the error level is deemed to be unacceptable, a more powerful or increased ECC scheme, such as DEC/TED, or TEC/QED, may be configured to replace the minimal SEC/DED ECC scheme.

For example, in the illustrated embodiment, three hard errors may be detected in the memory row 202*b*. In order to correct three errors the ECC3 (TEC/QED) scheme may be used. As this is a fault tolerant application or embodiment, it is considered acceptable that if a soft error (4 errors in total) occurs the ECC3 scheme will only be able to detect the error, not correct it. Thus, the ECC3 scheme allows the 3-bits of hard error in the defective memory row 202*b* to be corrected, but not any possible soft errors. In such an embodiment, the ECC3 scheme may be associated with the array block ECC3 210. In turn, this array block ECC3 210 may be associated with the address field 206*m*. In such an embodiment, the address of the defective memory row 202*b* may be entered or stored within the address field 206*m* and the ECC for the defective memory row 202*b* may be computed using the ECC3 scheme and the result stored within the array block ECC3 210. The minimal protection array block ECC1 204*b* may be unused or ignored.

In another example, in the illustrated embodiment, two hard errors may be detected in the memory row 202*d*. In order to correct two errors either the ECC3 (TEC/QED) or ECC2 (DEC/TED) schemes may be used. As this is a fault tolerant application or embodiment, the ECC2 scheme may be selected. This allows the 2-bits of hard error in the defective memory row 202*d* to be corrected but any possible soft errors will only be detected not corrected. In such an embodiment, the ECC2 scheme may be associated with the array blocks ECC2 208, ECC 208*a*, and/or ECC2 208*b*. As array block ECC2 208 is first and currently unused, it may be selected. In turn, this array block ECC2 208 may be associated with the address field 206. In such an embodiment, the address of the defective memory row 202*d* may be entered or stored within the address field 206 and the ECC for the defective memory row 202*d* may be computed using the ECC2 scheme and the result stored within the array block ECC2 208. The minimal protection array block ECC1 204*d* may be unused or ignored.

In yet another example, in the illustrated embodiment, one hard error may be detected in the memory row 202*e*. In order to correct one error either the ECC1 (SEC/DED), ECC2 (DEC/TED), or ECC3 (TEC/QED) schemes may be used. As this is a fault tolerant application or embodiment, the ECC1 scheme may be selected. This allows the 1-bit of hard error to be corrected, but if any soft error occurs, it may only be detected not corrected. As an array block (ECC1 204*e*) that is capable of providing the ECC1 scheme is already associated with the memory row 202*e*, the memory row 202*e* need not be added to the PAT 236 or serviced by the RECC array 238. In such an embodiment, the PAT 236 and the RECC array 238 may not be used for memory row 202*e*. The minimal protection array block ECC1 204*e* may continue to be used just as if no error had been detected, in the illustrated embodiment, In such an embodiment, as the memory rows 202, 202*a*, 202*c*, and 202*n* have no hard errors, they may continue to employ the minimal ECC fields 204, 204*a*, 204*c*, and 204*n*.

Likewise, in the illustrated embodiment, the array blocks ECC2 208*a* and 208*b*; and the address fields 206*a* and 208*b* may be unused, as there is no memory row in need of the additional ECC protection they provide. It is understood that the above is merely one illustrative example to which the disclosed subject matter is not limited.

As described above in reference to FIG. 3*a*, various embodiments may employ redundant memory rows (or no redundant memory rows at all), and/or may employ the RECC array 238 in a different fashion. For example, the memory row 202*e* may be associated with the array block 208*a* despite the ECC1 scheme being acceptable, as the ECC2 208*a* block would be unused otherwise. It is understood that the above is merely one illustrative example to which the disclosed subject matter is not limited.

Figure 4:
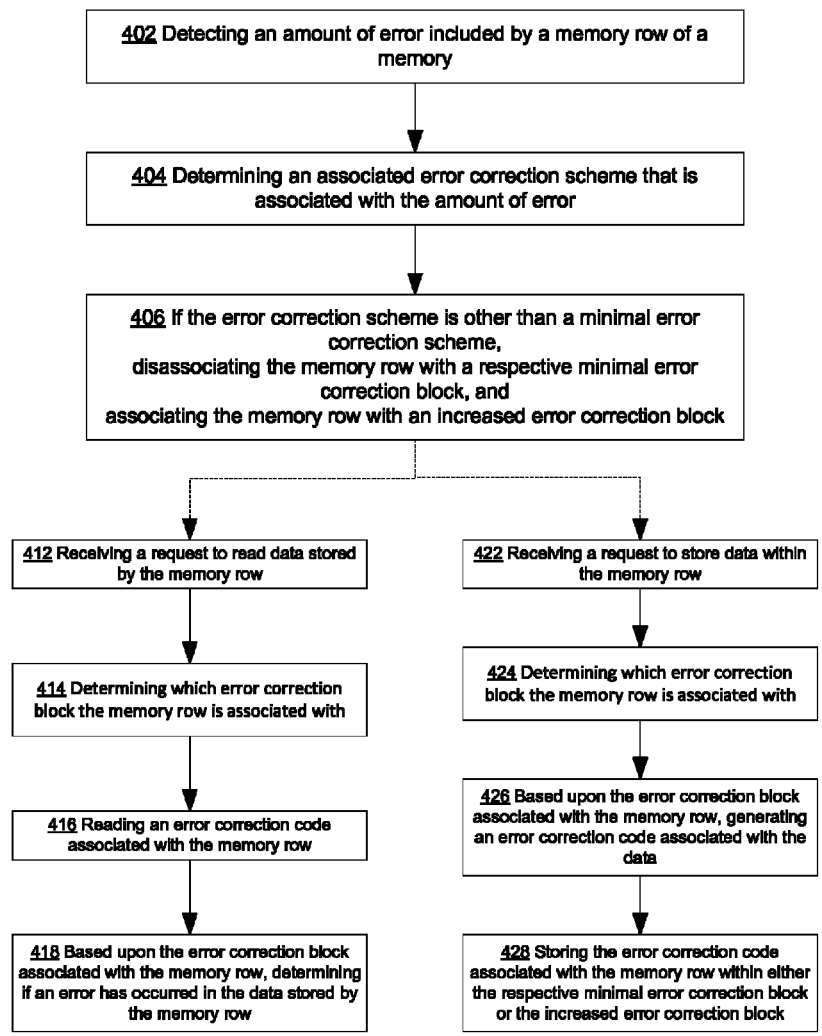
FIG. 4 is a flowchart of an example embodiment of a technique in accordance with the disclosed subject matter.

FIG. 4 is a flow chart of an example embodiment of a technique in accordance with the disclosed subject matter. In various embodiments, the technique 400 may be used or produced by the systems such as those of FIG. 1, 2, 3*a*, 3*b*, or 5. Although, it is understood that the above are merely a few illustrative examples to which the disclosed subject matter is not limited. It is understood that the disclosed subject matter is not limited to the ordering of or number of actions illustrated by technique 400.

Block 402 illustrates that, in one embodiment, an amount of error may be detected within or included in a memory row of a memory, as described above. In various embodiments, the memory row may be configured to store data, as described above. In various embodiments, one or more of the action(s) illustrated by this Block may be performed by the apparatuses or systems of FIG. 1 or 5, the memory 106 of FIG. 1, as described above.

Block 404 illustrates that, in one embodiment, an associated error correction scheme that is associated with the amount of error may be determined, as described above. In various embodiments, the memory row may include one or more errors, as described above. In such an embodiment, the associated error correction scheme may be configured to correct two or more errors, such that the scheme is configured to correct at least one more error than the number of detected errors, as described above. In various embodiments, one or more of the action(s) illustrated by this Block may be performed by the apparatuses or systems of FIG. 1 or 5, the memory system 103 of FIG. 1, as described above.

Block 406 of the illustrated embodiment shows that, if the error correction scheme is other than a minimal error correction scheme, the memory row may be disassociated with a respective minimal error correction block, as described above. In such an embodiment, the memory row may be associated with an increased error correction block, as described above. In such an embodiment, the increased error correction block may confirm with the associated error correction scheme, as described above.

In various embodiments, the memory row may be associated with an address or memory address, as described above. In one such embodiment, associating the memory row with the increased error correction block may include storing the address of the memory row within a programmable address table, as described above. In various embodiments, the programmable address table may be configured to indicate which increased error correction block is associated with the memory row, as described above.

In some embodiments, the memory may include the respective minimal error correction block, and a reconfigurable error correction array may include the increased error correction block, as described above. In one such embodiment, the respective minimal error correction block may be fixedly associated with the memory row, as described above. In such an embodiment, disassociating the memory row with a respective minimal error correction block may include disabling the respective minimal error correction block, as described above.

In various embodiments, associating the memory row with an increased error correction block may include compensating for the amount of error included by the memory row without altering an operational voltage of the memory row, as described above. In various embodiments, one or more of the action(s) illustrated by this Block may be performed by the apparatuses or systems of FIG. 1, 2, or 5, the RECC 108 of FIG. 1, the minimal ECC blocks 204 and/or increased ECC field or array block 207 of FIG. 2, as described above.

Block 412 illustrates that, in one embodiment, a request to read data stored by the memory row may be received, as described above. Block 414 illustrates that, in one embodiment, a determination may be made as to which error correction block the memory row is associated with, as described above. In various embodiments, the error correction block may include either the respective minimal error correction block or the increased error correction block, as described above. Block 416 illustrates that, in one embodiment, an error correction code associated with the memory row may be read, as described above. Block 418 illustrates that, in one embodiment, it may be determined if an error has occurred in the data stored by the memory row, as described above. In various embodiments, this determination may be based upon, at least in part, the error correction block associated with the memory row, as described above. In various embodiments, one or more of the action(s) illustrated by this Block may be performed by the apparatuses or systems of FIG. 1, 2, or 5, the Read Unit 105 and ECC decoders 115 of FIG. 1, the minimal ECC blocks 204 and/or increased ECC field or array block 207 of FIG. 2, as described above.

Block 422 illustrates that, in one embodiment, a request to store data within the memory row may be received, as described above. Block 424 illustrates that, in one embodiment, a determination may be made as to which error correction block the memory row is associated with, as described above. In various embodiments, the error correction block may include either the respective minimal error correction block or the increased error correction block, as described above. Block 426 illustrates that, in one embodiment, an error correction code associated with the data may be generated. In various embodiments, the generation of the error correction code may be based upon the error correction block associated with the memory row, as described above. Block 428 illustrates that, in one embodiment, the error correction code associated with the memory row may be stored within either the respective minimal error correction block or the increased error correction block, based upon which error correction block is associated with the memory row, as described above. In various embodiments, one or more of the action(s) illustrated by this Block may be performed by the apparatuses or systems of FIG. 1, 2, or 5, the Write Unit 104 and ECC encoders 114 of FIG. 1, the minimal ECC blocks 204 and/or increased ECC field or array block 207 of FIG. 2, as described above.

Figure 5:
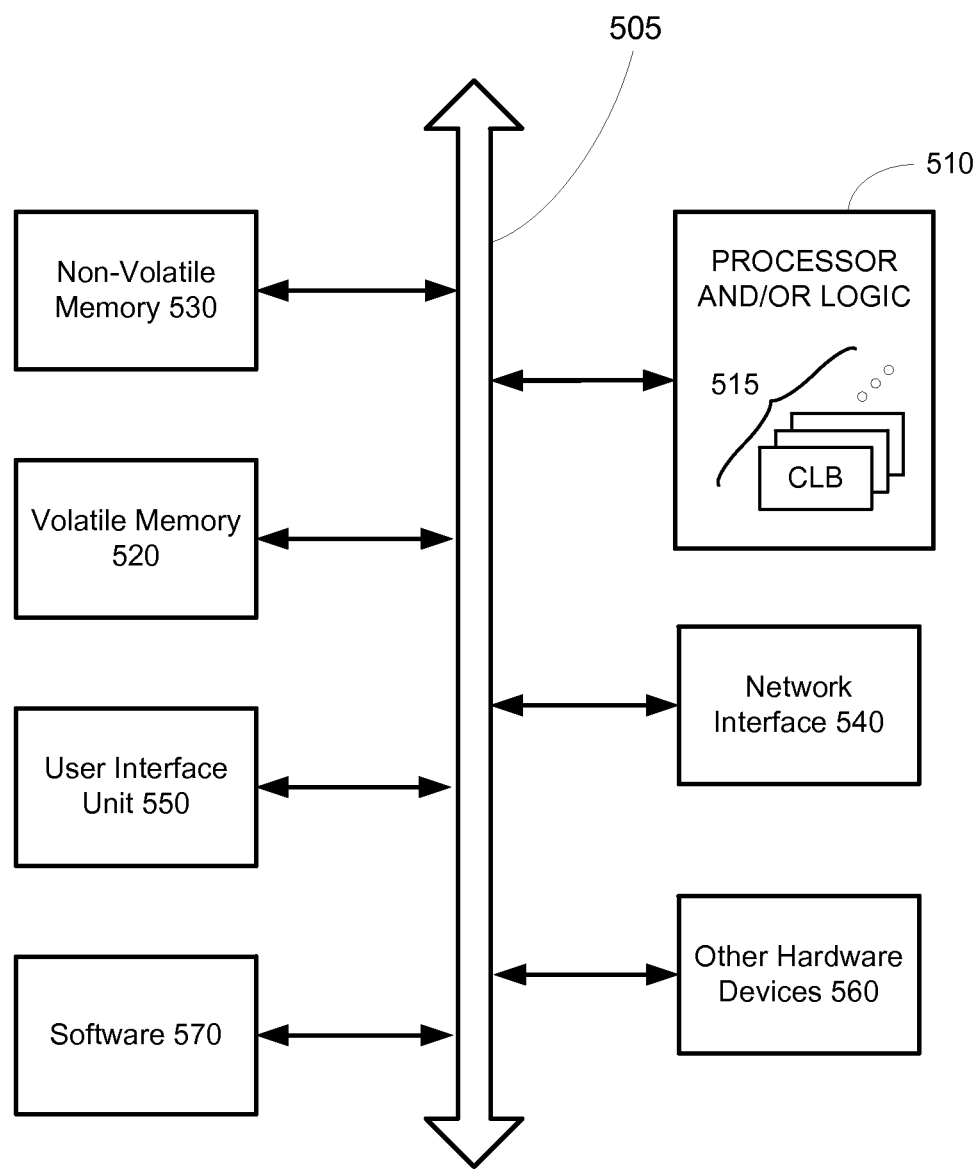
FIG. 5 is a schematic block diagram of an information processing system that may include devices formed according to principles of the disclosed subject matter.

FIG. 5 is a schematic block diagram of an information processing system 500, which may include semiconductor devices formed according to principles of the disclosed subject matter.

Referring to FIG. 5, an information processing system 500 may include one or more of devices constructed according to the principles of the disclosed subject matter. In another embodiment, the information processing system 500 may employ or execute one or more techniques according to the principles of the disclosed subject matter.

In various embodiments, the information processing system 500 may include a computing device, such as, for example, a laptop, desktop, workstation, server, blade server, personal digital assistant, smartphone, tablet, and other appropriate computers, etc. or a virtual machine or virtual computing device thereof. In various embodiments, the information processing system 500 may be used by a user (not shown).

The information processing system 500 according to the disclosed subject matter may further include a central processing unit (CPU), logic, or processor 510. In some embodiments, the processor 510 may include one or more functional unit blocks (FUBs) or combinational logic blocks (CLBs) 515. In such an embodiment, a combinational logic block may include various Boolean logic operations (e.g., NAND, NOR, NOT, XOR, etc.), stabilizing logic devices (e.g., flip-flops, latches, etc.), other logic devices, or a combination thereof. These combinational logic operations may be configured in simple or complex fashion to process input signals to achieve a desired result. It is understood that while a few illustrative examples of synchronous combinational logic operations are described, the disclosed subject matter is not so limited and may include asynchronous operations, or a mixture thereof. In one embodiment, the combinational logic operations may comprise a plurality of complementary metal oxide semiconductors (CMOS) transistors. In various embodiments, these CMOS transistors may be arranged into gates that perform the logical operations; although it is understood that other technologies may be used and are within the scope of the disclosed subject matter.

The information processing system 500 according to the disclosed subject matter may further include a volatile memory 520 (e.g., a Random Access Memory (RAM), etc.). The information processing system 500 according to the disclosed subject matter may further include a non-volatile memory 530 (e.g., a hard drive, an optical memory, a NAND or Flash memory, etc.). In some embodiments, either the volatile memory 520, the non-volatile memory 530, or a combination or portions thereof may be referred to as a "storage medium". In various embodiments, the volatile memory 520 and/or the non-volatile memory 530 may be configured to store data in a semi-permanent or substantially permanent form.

In various embodiments, the information processing system 500 may include one or more network interfaces 540 configured to allow the information processing system 500 to be part of and communicate via a communications network. Examples of a Wi-Fi protocol may include, but are not limited to, Institute of Electrical and Electronics Engineers (IEEE) 802.11g, IEEE 802.11n, etc. Examples of a cellular protocol may include, but are not limited to: IEEE 802.16m (a.k.a. Wireless-MAN (Metropolitan Area Network) Advanced), Long Term Evolution (LTE) Advanced), Enhanced Data rates for GSM (Global System for Mobile Communications) Evolution (EDGE), Evolved High-Speed Packet Access (HSPA+), etc. Examples of a wired protocol may include, but are not limited to, IEEE 802.3 (a.k.a. Ethernet), Fibre Channel, Power Line communication (e.g., HomePlug, IEEE 1901, etc.), etc. It is understood that the above are merely a few illustrative examples to which the disclosed subject matter is not limited.

The information processing system 500 according to the disclosed subject matter may further include a user interface unit 550 (e.g., a display adapter, a haptic interface, a human interface device, etc.). In various embodiments, this user interface unit 550 may be configured to either receive input from a user and/or provide output to a user. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

In various embodiments, the information processing system 500 may include one or more other devices or hardware components 560 (e.g., a display or monitor, a keyboard, a mouse, a camera, a fingerprint reader, a video processor, etc.). It is understood that the above are merely a few illustrative examples to which the disclosed subject matter is not limited.

The information processing system 500 according to the disclosed subject matter may further include one or more system buses 505. In such an embodiment, the system bus 505 may be configured to communicatively couple the processor 510, the volatile memory 520, the non-volatile memory 530, the network interface 540, the user interface unit 550, and one or more hardware components 560. Data processed by the processor 510 or data inputted from outside of the non-volatile memory 530 may be stored in either the non-volatile memory 530 or the volatile memory 520.

In various embodiments, the information processing system 500 may include or execute one or more software components 570. In some embodiments, the software components 570 may include an operating system (OS) and/or an application. In some embodiments, the OS may be configured to provide one or more services to an application and manage or act as an intermediary between the application and the various hardware components (e.g., the processor 510, a network interface 540, etc.) of the information processing system 500. In such an embodiment, the information processing system 500 may include one or more native applications, which may be installed locally (e.g., within the non-volatile memory 530, etc.) and configured to be executed directly by the processor 510 and directly interact with the OS. In such an embodiment, the native applications may include pre-compiled machine executable code. In some embodiments, the native applications may include a script interpreter (e.g., C shell (csh), AppleScript, AutoHotkey, etc.) or a virtual execution machine (VM) (e.g., the Java Virtual Machine, the Microsoft Common Language Runtime, etc.) that are configured to translate source or object code into executable code which is then executed by the processor 510.

The semiconductor devices described above may be encapsulated using various packaging techniques. For example, semiconductor devices constructed according to principles of the disclosed subject matter may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique, a wafer-level processed stack package (WSP) technique, or other technique as will be known to those skilled in the art.

Method steps may be performed by one or more programmable processors executing a computer program to perform functions by operating on input data and generating output. Method steps also may be performed by, and an apparatus may be implemented as, special purpose logic circuitry, e.g., an FPGA (field programmable gate array) or an ASIC (application-specific integrated circuit).

In various embodiments, a computer readable medium may include instructions that, when executed, cause a device to perform at least a portion of the method steps. In some embodiments, the computer readable medium may be included in a magnetic medium, optical medium, other medium, or a combination thereof (e.g., CD-ROM, hard drive, a read-only memory, a flash drive, etc.). In such an embodiment, the computer readable medium may be a tangibly and non-transitorily embodied article of manufacture.

While the principles of the disclosed subject matter have been described with reference to example embodiments, it will be apparent to those skilled in the art that various changes and modifications may be made thereto without departing from the spirit and scope of these disclosed concepts. Therefore, it should be understood that the above embodiments are not limiting, but are illustrative only. Thus, the scope of the disclosed concepts are to be determined by the broadest permissible interpretation of the following claims and their equivalents, and should not be restricted or limited by the foregoing description. It is, therefore, to be understood that the appended claims are intended to cover all such modifications and changes as fall within the scope of the embodiments.

What is claimed is:

1. An apparatus comprising:
a memory configured to store data;
a reconfigurable error correction array that includes a plurality of memory rows, each memory row configured to store a respective piece of data, and is configured to simultaneously provide a plurality of levels of error correction to the memory based, at least in part, upon a number of errors detected within the memory; and
a programmable address table configured to indicate which, if any, of the plurality of memory rows is associated with a respective one of the plurality of levels of error correction.

2. The apparatus of claim 1,
wherein the reconfigurable error correction array includes a plurality of error correction blocks, each error correction block associated with a respective level of error correction; and
wherein each error correction block is associated with a respective memory row.

3. The apparatus of claim 1, wherein the memory includes a plurality of minimal error correction code blocks, wherein each minimal error correction code block is associated with a respective memory row and configured to provide the respective memory row with a minimal level of error correction; and
wherein the reconfigurable error correction array includes a plurality of error correction code blocks, wherein each error correction code block is reconfigurably associated with zero or one respective defective memory rows, and is configured to provide the respective defective memory row an increased level of error correction.

4. The apparatus of claim 1, further comprising a read unit configured to process, at least in part, a read request for a piece of data that is stored in the memory,
wherein the read unit is configured to determine a level of error correction associated with the piece of data, and based upon the level of error correction associated with the piece of data, determine if an error exists within the piece of data.

5. The apparatus of claim 1, further comprising a write unit configured to process, at least in part, a write operation to store a piece of data within a location included by the memory; and
wherein the write unit is configured to:
determine a level of error correction associated with the location included by the memory, and,
based upon the level of error correction, generate an error correction code and store the error correction code within either the memory or the reconfigurable error correction array.

6. The apparatus of claim 1, wherein at least one memory row is a defective memory row that includes a number, greater than zero, of errors; and
wherein the defective memory row is associated with one of the plurality of levels of error correction that is capable of correcting no more than the number of errors of the defective memory row.

7. The apparatus of claim 1, wherein each level of error correction is associated with a respective number of error correction blocks; and
wherein the reconfigurable error correction array includes the error correction blocks.

8. A method comprising:
detecting an amount of error included in a memory row of a memory, wherein the memory row is configured to store data;
determining an associated error correction scheme that is associated with the amount of error; and
if the associated error correction scheme is other than a minimal error correction scheme, disassociating the memory row with a respective minimal error correction block, and associating, via a programmable address table, the memory row with an increased error correction block that is part of the associated error correction scheme.

9. The method of claim 8, wherein the memory row is associated with an address, and
wherein associating the memory row with an increased error correction block includes storing the address of the memory row within the programmable address table configured to indicate which increased error correction block is associated with the memory row.

10. The method of claim 8, wherein the memory includes the respective minimal error correction block; and
wherein a reconfigurable error correction array includes the increased error correction block.

11. The method of claim 8, wherein the memory includes the respective minimal error correction block and wherein the respective minimal error correction block is fixedly associated with the memory row; and
wherein disassociating the memory row with a respective minimal error correction block includes disabling the respective minimal error correction block.

12. The method of claim 8, further comprising:
receiving a request to read data stored by the memory row;
determining which error correction block the memory row is associated with, wherein the error correction block includes either the respective minimal error correction block or the increased error correction block;
reading an error correction code associated with the memory row; and
based upon the error correction block associated with the memory row, determining if an error has occurred in the data stored by the memory row.

13. The method of claim 8, further including:
receiving a request to store data within the memory row;
determining which error correction block the memory row is associated with, wherein the error correction block includes either the respective minimal error correction block or the increased error correction block;
based upon the error correction block associated with the memory row, generating an error correction code associated with the data; and
storing the error correction code associated with the memory row within either the respective minimal error correction block or the increased error correction block, based upon which error correction block is associated with the memory row.

14. The method of claim 8, wherein the memory row that includes a number, greater than zero, of errors; and
wherein the associated error correction scheme is capable of correcting one more error than the number of errors of the memory row.

15. The method of claim 8, wherein associating the memory row with an increased error correction block includes compensating for the amount of error included by the memory row without altering an operational voltage of the memory row.

16. A system comprising:
a processor configured to perform operation upon data; and
a memory system, the memory system including:
a memory configured to store data and comprising a plurality of memory rows
a programmable address table configured to indicate which, if any, of the plurality of memory rows is associated with, at least a portion of, a reconfigurable error correction array, and
the reconfigurable error correction array configured to provide a plurality of levels of error correction to the memory based, at least in part, upon a number of errors detected within the memory.

17. The system of claim 16, wherein the processor includes a load/store unit configured to process, at least in part, a write operation to store a piece of data within a location included by the memory; and
wherein the load/store unit is configured to:
determine a level of error correction associated with the location included by the memory, and,
based upon the level of error correction, generate an error correction code and store the error correction code within either the memory or the reconfigurable error correction array.

18. The system of claim 16, wherein the processor includes a load/store unit configured to process, at least in part, a read request for a piece of data that is stored in the memory; and
wherein the load/store unit is configured to:
determine a level of error correction associated with the piece of data, and,
based upon the level of error correction associated with the piece of data, determine if an error exists within the piece of data.

* * * * *